United States Patent
Ito et al.

(10) Patent No.: US 10,844,471 B2
(45) Date of Patent: Nov. 24, 2020

(54) SLIDING MEMBER FOR VEHICULAR SUSPENSION AND METHOD FOR PRODUCING SAME

(71) Applicants: RC-LOGO CO., LTD., Hamamatsu (JP); SHOWA CORPORATION, Gyoda (JP)

(72) Inventors: Kimio Ito, Hamamatsu (JP); Shigeki Awasa, Fukuroi (JP); Kohei Yamamoto, Fukuroi (JP)

(73) Assignees: RC-LOGO CO., LTD., Hamamatsu (JP); SHOWA CORPORATION, Gyoda (JP)

( * ) Notice: Subject to any disclaimer, the term of this patent is extended or adjusted under 35 U.S.C. 154(b) by 0 days.

(21) Appl. No.: 16/307,403

(22) PCT Filed: Jun. 15, 2017

(86) PCT No.: PCT/JP2017/022184
§ 371 (c)(1),
(2) Date: Dec. 5, 2018

(87) PCT Pub. No.: WO2017/217506
PCT Pub. Date: Dec. 21, 2017

(65) Prior Publication Data
US 2019/0301005 A1  Oct. 3, 2019

(30) Foreign Application Priority Data

Jun. 17, 2016 (JP) ................... 2016-120468
Apr. 26, 2017 (JP) ................... 2017-087733

(51) Int. Cl.
*B32B 9/00* (2006.01)
*C23C 14/08* (2006.01)
(Continued)

(52) U.S. Cl.
CPC ............ *C23C 14/083* (2013.01); *C23C 14/08* (2013.01); *C23C 14/32* (2013.01); *F16F 9/32* (2013.01); *B62K 25/08* (2013.01); *B62K 25/10* (2013.01)

(58) Field of Classification Search
None
See application file for complete search history.

(56) References Cited

U.S. PATENT DOCUMENTS

| 4,887,886 A | * | 12/1989 | Shimizu | ................ C23C 14/025 359/589 |
| RE34,173 E | * | 2/1993 | Kerber | ................ C23C 14/0641 416/241 B |

(Continued)

FOREIGN PATENT DOCUMENTS

| DE | 19511628 A1 | 10/1996 |
| DE | 202008007669 U1 | 10/2008 |

(Continued)

OTHER PUBLICATIONS

International Search Report dated Sep. 19, 2017 for the corresponding PCT International Patent Application No. PCT/JP2017/022184.
(Continued)

*Primary Examiner* — Seth Dumbris
*Assistant Examiner* — Kim S. Horger
(74) *Attorney, Agent, or Firm* — Leason Ellis LLP

(57) ABSTRACT

A sliding member for vehicular suspension includes a wear resistant layer having appropriate mechanical strength and high designability on its outer peripheral sliding face and a method for producing the same. On an outer peripheral sliding face of the sliding member for vehicular suspension, a colored wear resistant layer formed by an ion plating method and having a film thickness of 0.75 μm or more and 10 μm or less is included; and in the wear resistant layer, a dark blue titanium oxide layer, a titanium intermediate layer, and a colored titanium oxide layer are laminated in this order from the inner peripheral side toward the outer peripheral side.

7 Claims, 6 Drawing Sheets

(51) Int. Cl.
*C23C 14/32* (2006.01)
*F16F 9/32* (2006.01)
*B62K 25/08* (2006.01)
*B62K 25/10* (2006.01)

(56) References Cited

U.S. PATENT DOCUMENTS

| 6,354,008 | B1* | 3/2002 | Domoto | B26B 19/38 |
| | | | | 30/346.53 |
| 2009/0291276 | A1* | 11/2009 | Feng | C04B 41/009 |
| | | | | 428/209 |
| 2015/0368823 | A1* | 12/2015 | Curran | C25D 11/26 |
| | | | | 205/50 |

FOREIGN PATENT DOCUMENTS

| JP | 07-207446 A | | 8/1995 |
| JP | 08-021469 A | | 1/1996 |
| JP | 0821469 A | * | 1/1996 |
| JP | 3023530 B | | 3/2000 |
| JP | 2005-282589 A | | 10/2005 |

OTHER PUBLICATIONS

Extended European Search Report dated Feb. 7, 2020 for the corresponding European Patent Application No. 17813400.3.

* cited by examiner

SLIDING MEMBER FOR VEHICULAR SUSPENSION AND METHOD FOR PRODUCING SAME

CROSS-REFERENCE TO RELATED PATENT APPLICATIONS

This application is a U.S. National Phase application under 35 U.S.C. § 371 of International Patent Application No. PCT/JP2017/022184, filed Jun. 15, 2017, and claims the benefit of Japanese Patent Applications No. 2016-120468, filed on Jun. 17, 2016 and No. 2017-87733, filed on Apr. 26, 2017, all of which are incorporated herein by reference in their entirety. The International Application was published in Japanese on Dec. 21, 2017 as International Publication No. WO/2017/217506 under PCT Article 21(2).

FIELD OF THE INVENTION

The present invention relates to a sliding member for vehicular suspension and a method for producing the same.

BACKGROUND OF THE INVENTION

Hitherto, the surface of a sliding member for vehicular suspension, for example, the surface of an inner tube to be used for a front fork of motorcycle or bicycle, is subjected to a surface treatment for the purpose of improving the slidability or corrosion resistance. As a film to be formed by the surface treatment, a hard chromium plating film was general. In addition, as a special film, a titanium nitride film assuming a gold color, and a titanium oxide film assuming a dark blue or brown color, which are formed by the ion plating method, are known (see Japanese Patent No. 3023530).

In the sliding member for vehicular suspension, such as an inner tube, a part of the outer surface is exposed to the outside. For this reason, designability is also required for the sliding member. However, the color tone of the conventional hard chromium plating film is limited to a silver white metallic luster, so that its designability was poor. In addition, the titanium nitride film that is formed by the ion plating method is excellent in wear resistance, low frictional resistance, etc. and assumes a gold color, so that its designability is high; however, its color tone is limited to the gold color and lacks in variation. In addition, in the titanium oxide film, its color tone is also limited to a dark blue or brown color and lacks in variation.

Technical Problem

Then, an object of the present invention is to provide a sliding member for vehicular suspension including a wear resistant layer having appropriate mechanical strength and high designability on its outer peripheral sliding face and a method for producing the same.

SUMMARY OF THE INVENTION

Solution to Problem

In the conventional technology, a titanium nitride film is applied on the surface of a titanium layer, and a titanium oxide film is applied on that surface. However, according to this conventional technology, there was involved such a problem that when once scratched due to sliding, the films are liable to be peeled at an interface between the titanium nitride film and the titanium oxide film starting at the scratch. In order to solve the foregoing problem, the present inventors made extensive and intensive investigations. As a result, they investigated replacement of the titanium nitride film with a wear resistant layer made of a titanium oxide film and a titanium film. According to this, it has been found that even when once scratched due to sliding, not only the films are hardly peeled, but also it becomes possible to improve the designability, thereby leading to accomplishment of the present invention.

According to an aspect of the present invention, there is provided a sliding member for vehicular suspension comprising, on its outer peripheral sliding face, a colored wear resistant layer formed by an ion plating method and having a film thickness of 0.75 μm or more and 10 μm or less, the wear resistant layer including a dark blue titanium oxide layer, a titanium intermediate layer, and a colored titanium oxide layer, which are laminated in this order from an inner peripheral side toward an outer peripheral side of the sliding member.

In the above-described aspect of the present invention, the colored titanium oxide layer may be a bluish green titanium oxide layer having a film thickness of 0.15 μm or more and 0.19 μm or less.

According to an aspect of the present invention, there is provided a method for producing a sliding member for vehicular suspension including, on its outer peripheral sliding face, a colored wear resistant layer formed by an ion plating method and having a film thickness of 0.75 μm or more and 10 μm or less, the wear resistant layer including a dark blue titanium oxide layer, a titanium intermediate layer, and a colored titanium oxide layer, which are laminated in this order from an inner peripheral side toward an outer peripheral side of the sliding member, wherein the ion plating method comprises using an HCD type ion plating apparatus, setting a beam output of the apparatus on forming the colored titanium oxide layer to 180 to 280 A, and controlling an oxygen gas partial pressure within a vacuum tank of the apparatus to a range of $8.1 \times 10^{-2}$ Pa or more and $1.2 \times 10^{-1}$ Pa or less.

In the above-described aspect of the present invention, the colored titanium oxide layer may be a bluish green titanium oxide layer having a film thickness of 0.15 μm or more and 0.19 μm or less.

Advantageous Effects of Invention

In accordance with the present invention, a sliding member for vehicular suspension including a wear resistant layer having appropriate mechanical strength and high designability on its outer peripheral sliding face and a method for producing the same are provided.

BRIEF DESCRIPTION OF THE DRAWINGS

FIG. 4(a) is Example 1, FIG. 4(b) is Comparative Example 1, FIG. 4(c) is Comparative Example 2, FIG. 4(d) is Comparative Example 3, and FIG. 4(e) is Comparative Example 4.

DETAILED DESCRIPTION OF THE INVENTION

Figure 1:
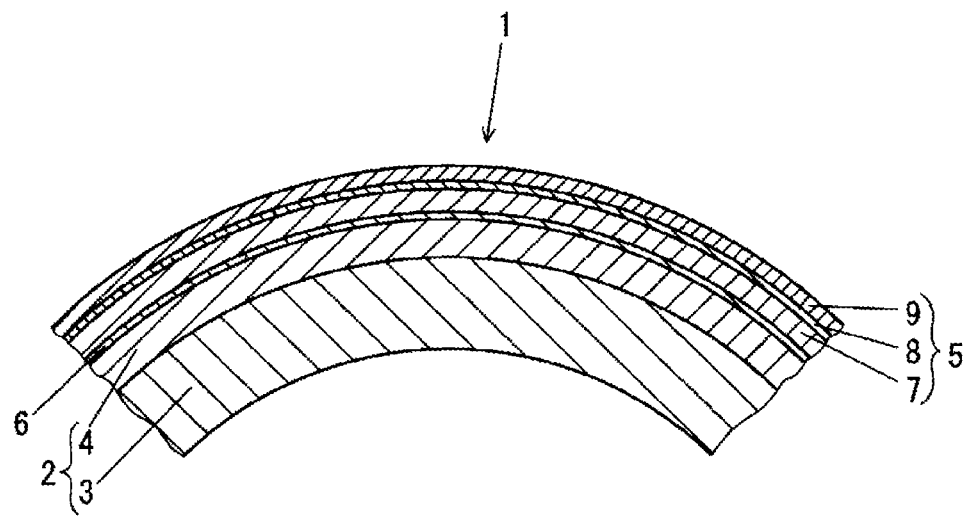
FIG. 1 is a cross-sectional view of a sliding member for vehicular suspension by the Examples of the present invention.

Modes for carrying out the present invention are hereunder described specifically on the basis of the accompanying drawings. In the present invention, the wording "high designability" refers to the matter that an interference color is assumed. As shown in the sectional explanatory view of FIG. 1, a sliding member 1 for vehicular suspension according to the Examples of the present invention includes a base material 2 of a cylindrical sliding member (one having a hard chromium plating 4 applied on a steel material 3) and a colored wear resistant layer 5 that is provided on an outer peripheral sliding face of the base material 2. This wear resistant layer 5 is formed by the ion plating method. Here, the wear resistant layer 5 is provided on the base material 2 via an undercoat layer 6 of titanium. The wear resistant layer 5 includes a dark blue titanium oxide layer 7, a titanium intermediate layer 8, and a colored (yellow, reddish purple, or bluish green) titanium oxide layer 9, which are successively laminated from the inner peripheral side toward the outer peripheral side.

The dark blue titanium oxide layer 7, the titanium intermediate layer 8, and the colored titanium oxide layer 9, which are laminated in this order from the inner peripheral side toward the outer peripheral side, are defined as a set of layer structure. The wear resistant layer 5 in the present invention has only to include at least one set of layer structure, and one or more sets of layer structure may be provided between the wear resistant layer 5 and the base material 2. For example, in the wear resistant layer 5 made of two sets of layer structure, the dark blue titanium oxide layer 7, the titanium intermediate layer 8, and the colored titanium oxide layer 9 are successively laminated, and the dark blue titanium oxide layer 7, the titanium intermediate layer 8, and the colored titanium oxide layer 9 are further successively laminated thereon.

Alternatively, a layer different from the foregoing layer may intervene between the base material 2 and the set of layer structure. For example, the wear resistant layer 5 may be constituted such that the dark blue titanium oxide layer 7, the titanium intermediate layer 8, and the colored titanium oxide layer 9 are successively laminated on a brown titanium oxide layer. In addition, the dark blue titanium oxide layer 7, the titanium intermediate layer 8, the colored titanium oxide layer 9, titanium intermediate layer 8, and the colored titanium oxide layer 9 may also be successively laminated.

It is to be noted that the undercoat layer 6 may not be provided depending upon the material quality of the base material 2. In FIG. 1, though the cylindrical sliding member is illustrated, there is a case of a round bar-shaped sliding member.

Examples of the sliding member 1 for vehicular suspension include an inner tube of a front fork and a piston rod of a rear suspension of motorcycle, an inner tube of a front fork of bicycle, and an inner tube of a shock absorber of car.

The ion plating method is a vacuum deposition method utilizing a phenomenon in which an evaporated metal that has been ionized by discharge and a reactive gas form a film of a metal or ceramics while repeating an appropriate impact against the negatively impressed base material 2. In the vacuum deposition method, an electrically active evaporated metal is favorably attached to the base material 2 upon being given energy due to an electric field. According to this, a film having excellent adhesion can be formed.

It is desired that a film thickness of the colored wear resistant layer 5 (the dark blue titanium oxide layer 7, the titanium intermediate layer 8, and the colored titanium oxide layer 9) that is formed on the surface of the base material 2 of the sliding member by the foregoing ion plating method is in a range of from 0.75 to 10 μm, and preferably from 1 to 2 μm. When the film thickness is less than 0.75 μm, the designability is liable to be worsened due to a wear scar. On the other hand, though the upper limit of the film thickness is not particularly limited, in the case of thickening the film, only the dark blue titanium oxide layer 7 is thickened. As the dark blue titanium oxide layer 7 becomes thicker, a longer treatment time is required, resulting in high costs. When the dark blue titanium oxide layer 7 becomes extremely thick (exceeding 10 μm), it is liable to be peeled due to the impact. The film thickness ranging from 1 to 2 μm provides sufficient wear resistance and is advantageous in cost and practically useful.

In the wear resistant layer 5, the titanium intermediate layer 8 plays an important role for the purpose of obtaining a desired color (yellow, reddish purple, or bluish green color) while securing the film thickness of a predetermined value or more (0.75 μm or more) in order to keep the sufficient wear resistance. It is to be noted that as a material quality of the base material 2 of the sliding member for vehicular suspension, a structural alloy steel that is excellent in toughness is general. Alternately, as illustrated in FIG. 1, the hard chromium plating 4 may be applied on such a structural alloy steel 3. Besides, an aluminum material, a carbon fiber material, and so on may also be used.

The titanium oxide film 9 serving as an outermost layer of the wear resistant layer 5 assumes a color (yellow, reddish purple, or bluish green color). By properly controlling the treatment conditions by the ion plating method, particularly an introduction amount of an oxygen gas into a vacuum tank of an ion plating apparatus and a beam output, the titanium oxide film 9 can be colored to a desired color. The introduction amount of an oxygen gas is regulated according to the beam output (180 to 280 A, and preferably 200 to 260 A), to control an oxygen gas partial pressure within the vacuum tank to a range of from $8.1 \times 10^{-2}$ to $1.2 \times 10^{-1}$ Pa, and preferably from $9.7 \times 10^{-2}$ to $1.1 \times 10^{-1}$ Pa. When the oxygen gas partial pressure is more than $1.2 \times 10^{-1}$ Pa, a feeling of transparency increases and becomes polychromic, so that there is a case where the desired color is hardly obtained, or the coating treatment becomes difficult depending upon a performance of the ion plating apparatus. When the oxygen gas partial pressure is less than $8.1 \times 10^{-2}$ Pa, both chroma and brightness become low, and it becomes dark, so that the desired color is hardly obtained. When the beam output is less than 180 A, a long time is needed for the treatment, and the productivity is worsened. When the beam output is more than 280 A, a deposition rate becomes large, and the film thickness of each site on the member surface is scattered to cause color irregularity, so that the product value is lowered.

Specifically, in order to obtain the titanium oxide film 9 having a yellow, reddish purple, or bluish green color, for example, when the beam output is 260 A, the oxygen gas pressure is controlled to $1.1 \times 10^{-1}$ Pa. When the beam output is 200 A, the oxygen gas pressure is controlled to $9.7 \times 10^{-2}$ Pa.

At the stage of introducing the oxygen gas, the color tone of the titanium oxide film 9 successively changes to yellow, red, and blue, and again changes to yellow, red, and blue, and this is repeated several times. However, as for the color tone, the brightness, the chroma, and the hue change every repetition. Then, at the point of time when the titanium oxide film 9 becomes the desired color, a shutter is closed to terminate the deposition.

Though a film thickness of the titanium oxide film 9 is approximately 0.05 to 0.3 μm, the target film thickness varies with the color to be obtained. In the bluish green titanium oxide film 9, its film thickness is in a range of from 0.15 to 0.19 μm, and preferably from 0.16 to 0.18 μm. When the film thickness is more than 0.19 μm, the color becomes yellowish green to yellow, so that the bluish green color is not obtained, whereas when the film thickness is less than 0.15 μm, the color becomes reddish purple, so that the bluish green color is not obtained.

Figure 2:
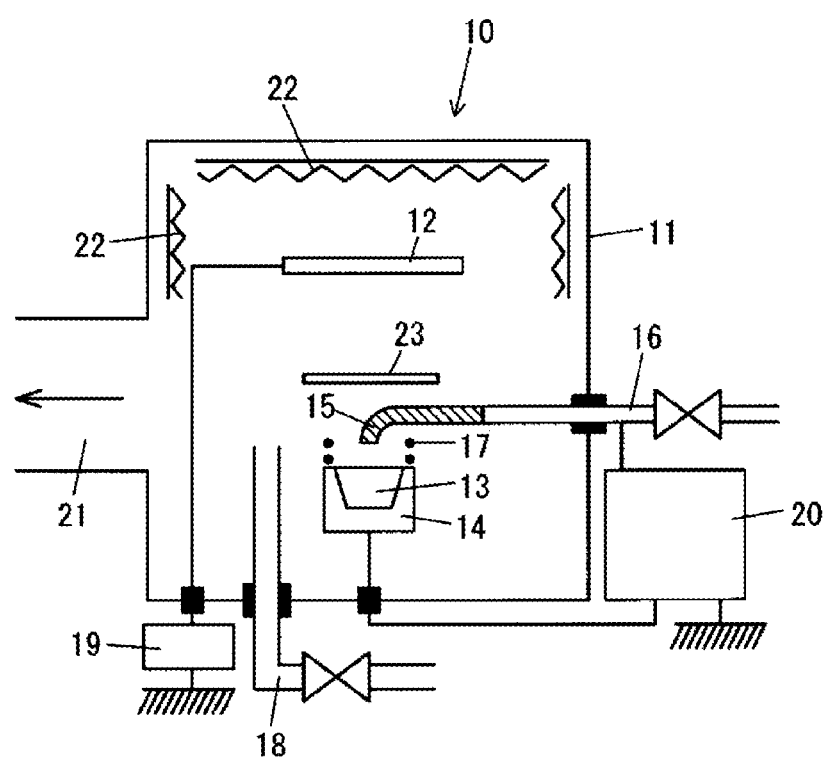
FIG. 2 is a view showing an ion plating apparatus that is used for carrying out the present invention.

An outline of an HCD (hollow cathode discharge) type ion plating apparatus 10 that is used in the present invention is shown in FIG. 2. In FIG. 2, a work 12 that is an object to the coating treatment is arranged within a vacuum tank 11. A water-cooled copper hearth 14 for receiving a Ti raw material 13 that is a metal to be evaporated is arranged beneath the work 12. A hollow cathode-type electron gun (hollow cathode) 15 that melts and evaporates the Ti raw material 13 is provided right above the hearth 14. An Ar gas introduction pipe 16 is connected to the hollow cathode 15. A focusing coil 17 for focusing electron beams to irradiate them on the Ti raw material 13 is arranged between the hearth 14 and the hollow cathode 15.

A symbol 18 is an introduction pipe for introducing a reactive gas 02; a symbol 19 is a direct current bias power source for impressing a bias voltage to the work 12; a symbol 20 is a direct current power source for flowing a high-frequency superimposed direct current between the hollow cathode 15 and the hearth 14; and a symbol 21 is a vent. A heater 22 for heating the work 12 is provided within the vacuum tank 11. A shutter 23 is provided between the work 12 and the hollow cathode-type electron gun 15.

An example of a process of coating the wear resistant layer on the outer peripheral sliding face of the inner tube by using the above-described apparatus is shown. First of all, a stain or grease of a structural alloy steel-made inner tube base material to which a hard chromium plating serving as the work has been applied is removed. Furthermore, a pre-treatment for removing an oxide film on the outer peripheral face is performed. The work 12 which has been subjected to the foregoing pre-treatment is installed in a non-illustrated tool within the vacuum tank 11, and the Ti raw material 13 is inserted into the hearth 14.

When the foregoing pre-treatment has been completed, the inside of the vacuum tank 11 is allowed to reduce the pressure to approximately $7.7 \times 10^{-3}$ Pa or less while heating to 300° C. or higher (approximately 300 to 320° C.), and after the work reaches the predetermined temperature, the temperature is kept for a fixed time (approximately 30 to 60 minutes). It is to be noted that the heating temperature may be higher than this temperature so long as the material quality of the metallographic structure or mechanical strength of the work does not alter.

Subsequently, a high-purity argon gas is introduced into the vacuum tank 11, and a negative voltage of approximately 500 V is impressed to the work 12 under a pressure of approximately $4.67 \times 10^{-2}$ Pa, thereby performing cleaning of the work surface by means of an ion bombardment treatment.

Subsequently, an argon gas is introduced into the Ta-made hollow cathode 15 to achieve ignition (the electric current is approximately 300 A). The titanium 13 in the hearth 14 is melted, whereby the titanium evaporates, and after stabilized, the electric current is raised to approximately 360 A. By keeping for a fixed time (approximately 3 to 5 minutes), impurities, such as oxides, of the surface of the titanium 13 accommodated in the hearth 14 are flied and removed. In the treatment process up to the moment, in order to prevent deposition of the impurities on the work 12 from occurring, the shutter 23 between the hearth 14 and the work 12 is closed. It is to be noted that as for the numerical values as described above, such as the temperatures, the pressures, the voltages, and the electric current values, only one example is shown, and it should be construed that they are not limited to the foregoing numerical values.

Subsequently, the shutter 23 is opened, only the titanium is evaporated, and only the titanium is deposited on the work 12 to form the undercoat layer 6, thereby contemplating to improve the adhesion. A thickness of the undercoat layer 6 is preferably 0.05 to 0.2 μm from the standpoint of improving the adhesion. The processing is performed at a beam output of 320 to 360 A for an arbitrary time (approximately 1 to 3 minutes).

After undercoating the titanium, an oxygen gas is introduced from the reactive gas introduction pipe 18, to form the titanium oxide film 7. At this time, the treatment conditions are set such that the beam output is 320 to 360 A; the oxygen gas partial pressure is $5.6 \times 10^{-2}$ to $7.3 \times 10^{-2}$ Pa; the bias voltage is 40 V; the heating temperature is 300 to 320° C.; and the deposition time is 15 to 30 minutes. At the initial stage of introducing the oxygen gas, the color tone of the film 7 successively changes to yellow, red, and blue, and again changes to yellow, red, and blue, and this is repeated several times. However, as the film thickness of the film 7 becomes large, the color tone gradually becomes cloudy and assumes a dark blue color. After this, even if the film thickness becomes larger, the color tone becomes constant.

After reaching the predetermined time, the introduction of the oxygen gas is stopped, the beam output is decreased to 200 to 260 A, and only the titanium is deposited in a thickness of approximately 0.05 to 0.2 μm for an arbitrary time (approximately 1 to 2 minutes) in the same manner as in the undercoat layer, thereby forming an intermediate titanium layer. This step is necessary for regulating the chroma, the brightness, and the hue of the colored color to be deposited, and the desired color can be obtained by this step.

Subsequently, the oxygen gas is again introduced (the oxygen gas partial pressure is $8.1 \times 10^{-2}$ to $1.2 \times 10^{-1}$ Pa, and preferably $9.7 \times 10^{-2}$ to $1.1 \times 10^{-1}$ Pa), and the beam output is regulated to 180 to 280 A, and preferably 200 to 260 A, thereby depositing a titanium oxide film. Here, at the initial stage of introducing the oxygen gas, the color tone successively changes to yellow, red, and blue, and again changes to yellow, red, and blue.

This time is the stage on the way where the bluish green system to be obtained changes from the blue color of the second lap to the yellow color of the third lap in the color change, and when reaching the desired color, the shutter is closed to terminate the deposition.

On the structural alloy steel-made base material 2 having the hard chromium plating 4 serving as the work applied thereto, the ion plating treatment was performed under the treatment conditions shown in Table 1, thereby preparing samples of Example 1 and Comparative Examples 1 to 4, followed by performing a durability test and judgement for film thickness, designability, etc. The results are also shown in Table 1. In Table 1, as for the beam output and the gas partial pressure, the treatment conditions on the occasion of forming a titanium oxide film or a titanium nitride film that is an outermost layer are shown.

be noted that with respect to each of Example 1 and Comparative Examples 1 to 4, the measurement results of three spots (three indentation photographs and applied load curves) are shown. In the indentation photographs, one side is 9 μm. The abscissa in each of the applied load curves indicates a pushed-in depth.

The three photographs lined up vertically in the column of FIG. 4(*a*) are photographs showing the indentation shape of Example 1. The three photographs lined up vertically in the column of FIG. 4(*b*) are photographs showing the indentation shape of Comparative Example 1. The three photographs lined up vertically in the column of FIG. 4(*c*) are photographs showing the indentation shape of Comparative

TABLE 1

|  | Film quality | Color tone | Beam output | Gas partial pressure (Pa) | Film thickness (μm) |
|---|---|---|---|---|---|
| Example 1 | Titanium undercoat + titanium oxide (dark blue) + titanium intermediate layer + titanium oxide (bluish green) | Bluish green | 230 A | $O_2$: $9.7 \times 10^{-2}$ to $1.1 \times 10^{-1}$ | 1.05 |
| Comparative Example 1 | Titanium undercoat + titanium nitride | Gold | 230 A | $N_2$: $1.7 \times 10^{-1}$ to $1.7 \times 10^{-1}$ | 0.98 |
| Comparative Example 2 | Titanium undercoat + titanium oxide (dark blue) | Dark blue | 230 A | $O_2$: $6.2 \times 10^{-2}$ to $6.4 \times 10^{-2}$ | 1.29 |
| Comparative Example 3 | Titanium oxide (bluish green) | Bluish green | 230 A | $O_2$: $9.7 \times 10^{-2}$ to $9.7 \times 10^{-2}$ | 0.18 |
| Comparative Example 4 | Titanium undercoat + titanium nitride + titanium oxide (bluish green) | Bluish green | 230 A | $O_2$: $9.7 \times 10^{-2}$ to $9.7 \times 10^{-2}$ | 0.88 |

|  | Judgement of indentation observation | Judgement of designability of sliding scar free from influence against functions | Overall judgement |
|---|---|---|---|
| Example 1 | Good | The designability is high; the exposure of Cr plating is not observed; and though the exposure of titanium oxide (dark blue) layer is observed but not noticeable. | Good |
| Comparative Example 1 | Good | The designability is high; and the exposure of Cr plating is not observed. | Exclusive |
| Comparative Example 2 | Good | The designability is high; and the exposure of Cr plating is not observed. | Exclusive |
| Comparative Example 3 | Good | The designability is low; and the exposure of Cr plating is observed. | Poor |
| Comparative Example 4 | Poor | The designability is low; and the exposure of TiN layer is noticeable. | Poor |

Figure 3:
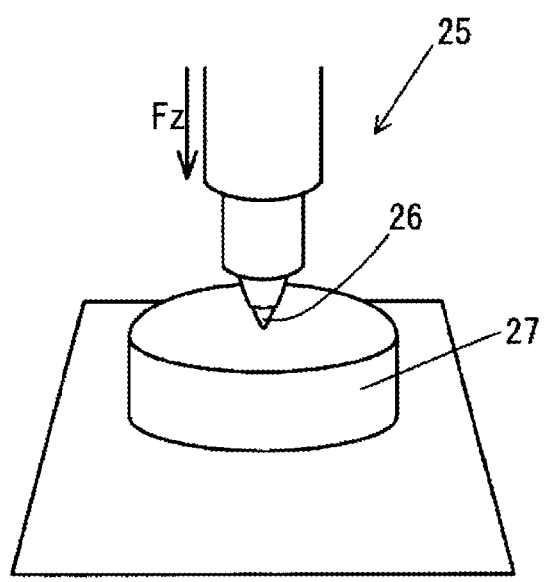
FIG. 3 is a view showing an adhesion test method.

Here, the test of durability was evaluated in terms of adhesion (peeling resistance) with the following micro hardness tester. That is, so far as a micro hardness tester ("Nanoindentation Tester", manufactured by Anton Paar) 25, an outline of which is shown in FIG. 3, was used; a Berkovich indenter 26 having a triangular pyramid shape was pushed into a sample 27 at a load (Fz) of 50 mN (milliNewton); the peripheral state of the indentation generated by the indenter 26 was observed, and as a result, no peeling was confirmed; and an applied load curve was a smooth quadratic curve, such case was considered to be acceptable.

Besides Example 1, with respect to, as the Comparative Examples, the single-layered film of titanium nitride (Comparative Example 1), the single-layered film of titanium oxide (dark blue) (Comparative Example 2), the single-layered film of titanium oxide (bluish green) (Comparative Example 3), and the film having titanium oxide (bluish green) superimposed on titanium nitride (Comparative Example 4), indentation photographs (FIGS. 4(*a*) to 4(*e*)) and applied load curves (FIGS. 5 to 7B) are shown. It is to Example 2. The three photographs lined up vertically in the column of FIG. 4(*d*) are photographs showing the indentation shape of Comparative Example 3. The three photographs lined up vertically in the column of FIG. 4(*e*) are photographs showing the indentation shape of Comparative Example 4.

Figure 5:
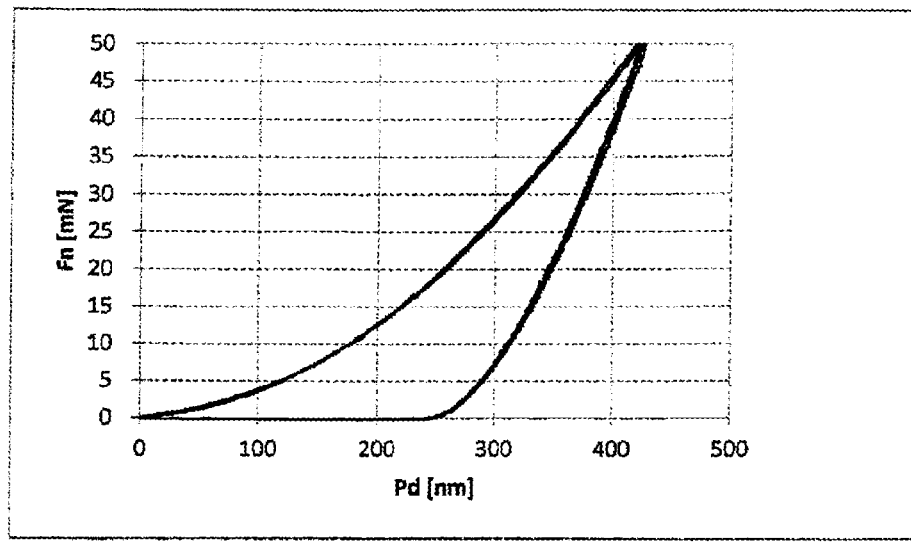
FIG. 5 is an applied load curve of Example 1.
Figure 6A:
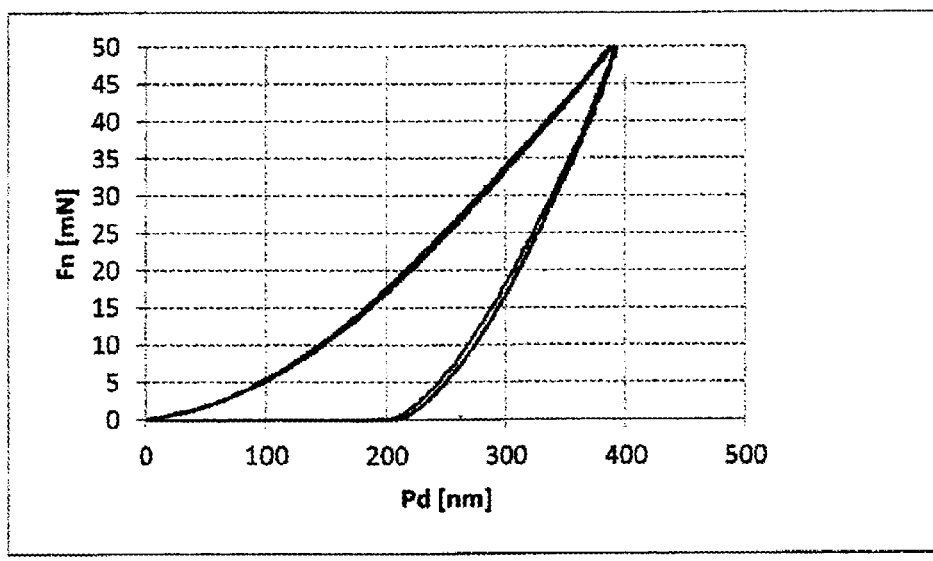
FIG. 6A is an applied load curve of Comparative Example 1.
Figure 6B:
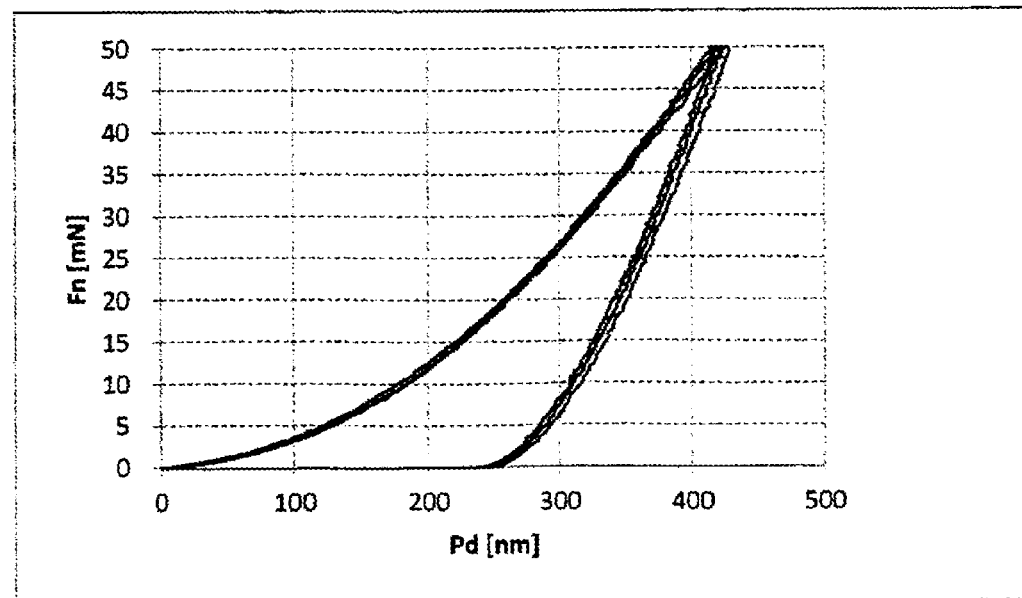
FIG. 6B is an applied load curve of Comparative Example 2.
Figure 7A:
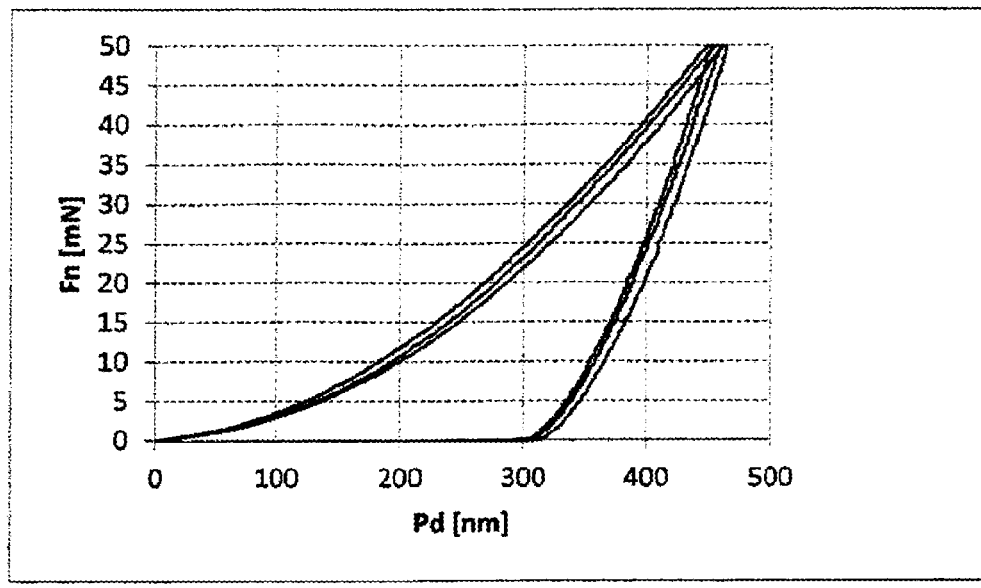
FIG. 7A is an applied load curve of Comparative Example 3.
Figure 7B:
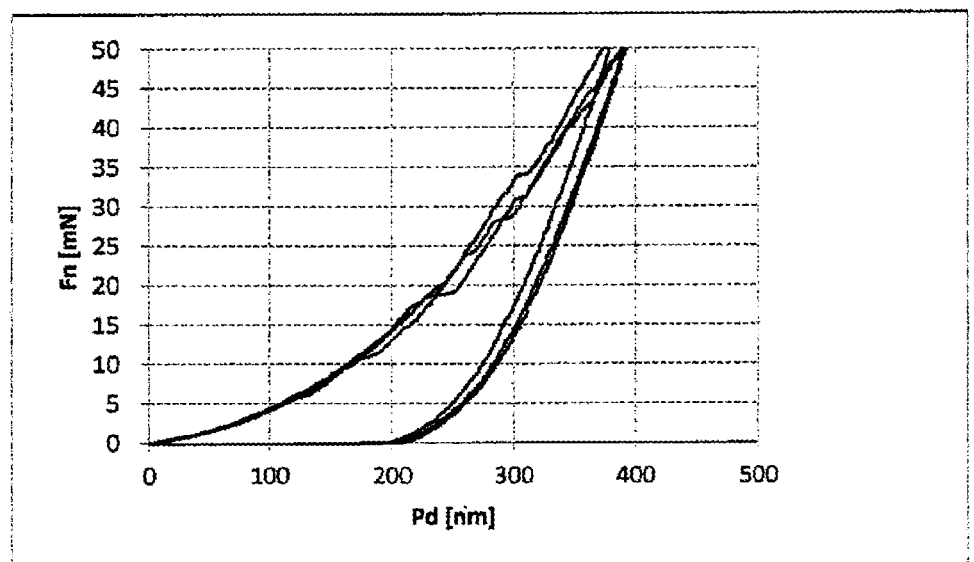
FIG. 7B is an applied load curve of Comparative Example 4.

FIG. 5 shows an applied load curve of Example 1; FIG. 6A shows an applied load curve of Comparative Example 1; FIG. 6B shows an applied load curve of Comparative Example 2; FIG. 7A shows an applied load curve of Comparative Example 3; and FIG. 7B shows an applied load curve of Comparative Example 4.

As noted from these results, the single-layered film of titanium nitride (Comparative Example 1), the single-layered film of titanium oxide (dark blue) (Comparative Example 2), and the single-layered of titanium oxide (bluish green) (Comparative Example 3) are free from peeling in the indentation portion and good (FIGS. 4(*b*) to 4(*d*)).

In the single-layered film of titanium oxide (bluish green) (Comparative Example 3), though the results of the peeling test with the micro hardness tester are good (see FIG. 4(*d*)), since the film thickness is thin, the chromium plating layer is exposed due to a wear scar, thereby impairing the designability (see Table 1). But, even when the film thickness is thin in this way, the functionality is not impaired.

Figure 4E:
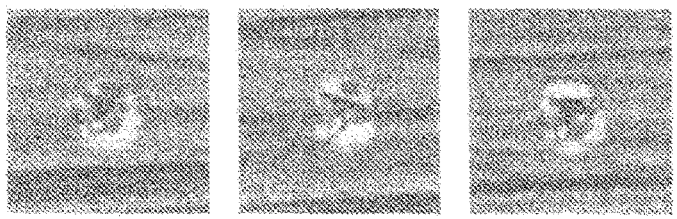
FIGS. 4(a) to 4(e) are photographs each of which shows an indentation shape.
Figure 4D:
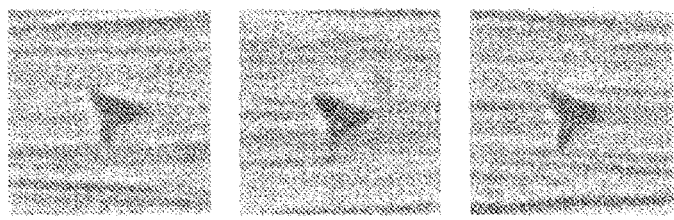
Figure 4C:
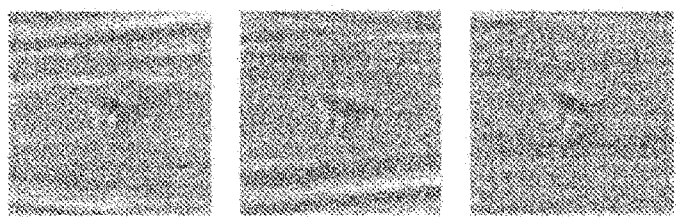
Figure 4B:
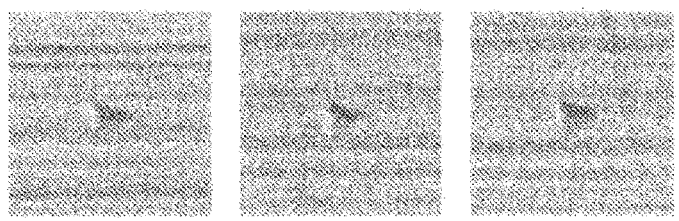

In the film having titanium oxide (bluish green) superimposed on titanium nitride (Comparative Example 4), as is clear from the photographs regarding the test results with the micro hardness tester (FIG. 4(e)), peeling is generated in the indentation portion, and therefore, it is not suitable for practical use. In addition, the applied load curve does not become a smooth quadratic curve (FIG. 7B), and it is poor.

Figure 4A:
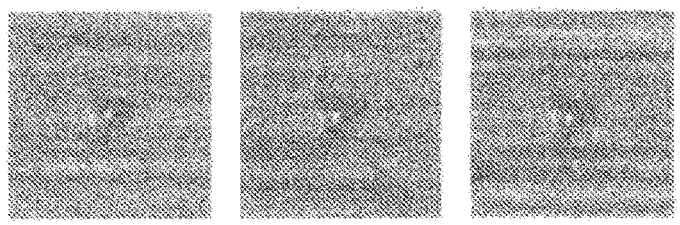

In the film according to Example 1, in which the titanium intermediate layer and the titanium oxide (bluish green) are superimposed on the titanium oxide (dark blue), no peeling is generated in the indentation portion (FIG. 4(a)). The bluish green color and the dark blue color have a similar color to each other. For this reason, in the wear resistant layer of Example 1, even when the titanium oxide (dark blue) film is exposed from the titanium oxide (bluish green) film due to the wear scar, the exposed portion of the titanium oxide (dark blue) film is hardly noticeable from the titanium oxide (bluish green) film. In addition, the wear resistant layer of Example 1 has a desired color (bluish green system). In this way, the wear resistant layer of Example 1 is extremely excellent in the designability. In addition, the applied load curve becomes a smooth quadratic curve), and it is good (FIG. 5). In addition, even when the film thickness is thin in this way, there is no problem from the standpoint of functionality.

As to the treatment conditions on the occasion of forming the titanium oxide film that is an outermost layer, the beam output was changed in various ways to prepare samples, which were then evaluated. The results are shown in Table 2.

TABLE 2

| | Beam output (A) | Film thickness (μm) | Color irregularity in the rotational direction | Evaluation | Good or not |
|---|---|---|---|---|---|
| Comparative Example 5 | 170 | 0.17 | No | Long time is required | Poor |
| Example 2 | 180 | 0.15 | No | Good | Good |
| Example 3 | 200 | 0.17 | No | Good | Good |
| Example 4 | 260 | 0.18 | No | Good | Good |
| Example 5 | 280 | 0.18 | No | Good | Good |
| Comparative Example 6 | 290 | 0.17 | Yes | Color irregularity is present | Poor |

As noted from the results of Table 2, Comparative Example 5 in which the beam output is less than 180 A (170 A) required a long time for the treatment and was inferior in the productivity. Examples 2 to 5 in which the beam output is 180 A to 280 A were good. Comparative Example 6 in which the beam output is more than 280 A (290 A) had color irregularity and was poor.

As to the treatment conditions on the occasion of forming the titanium oxide film that is an outermost layer, the oxygen gas partial pressure was changed in various ways to prepare samples, which were then evaluated. The results are shown in Table 3.

TABLE 3

| | Beam output (A) | Oxygen partial pressure (Pa) | Film thickness (μm) | Chroma and brightness | Good or not |
|---|---|---|---|---|---|
| Comparative Example 7 | 230 | $8.0 \times 10^{-2}$ | 0.17 | Dark | Poor |
| Example 6 | 230 | $8.1 \times 10^{-2}$ | 0.17 | Good | Good |
| Example 7 | 230 | $9.7 \times 10^{-2}$ | 0.17 | Good | Good |
| Example 8 | 230 | $1.1 \times 10^{-1}$ | 0.18 | Good | Good |
| Example 9 | 230 | $1.2 \times 10^{-1}$ | 0.17 | Good | Good |
| Comparative Example 8 | 230 | $1.3 \times 10^{-1}$ | — | Impossible for coating from the standpoint of performance of apparatus | — |

As noted from the results of Table 3, Comparative Example 7 in which the oxygen gas partial pressure is less than $8.1 \times 10^{-2}$ Pa ($8.0 \times 10^{-2}$ Pa) was low in the brightness (dark) and poor. Examples 6 to 9 in which the oxygen gas partial pressure is $8.1 \times 10^{-2}$ Pa to $1.2 \times 10^{-1}$ Pa were good in both the brightness and the chroma. In Comparative Example 8 in which the oxygen gas partial pressure is more than $1.2 \times 10^{-1}$ Pa ($1.3 \times 10^{-1}$ Pa), coating was impossible from the standpoint of performance of the ion plating apparatus.

In order to verify the lower limit value of the total film thickness of the wear resistant layer, samples having a film thickness of the wear resistant layer of 0.70 μm and 0.75 μm, respectively were prepared.

When the total film thickness of the titanium intermediate film and the colored titanium oxide layer was 0.20 μm, the color tone exhibited a bluish green system. In consequence, in order that the total film thickness of the wear resistant layer may become 0.70 μm, the film thickness of the dark blue titanium oxide layer becomes 0.50 μm; and in order that the total film thickness may become 0.75 μm, the film thickness of the dark blue titanium oxide layer becomes 0.55 μm. Then, the samples having a film thickness of the dark blue titanium oxide layer of 0.50 μm and 0.55 μm, respectively were prepared and evaluated. The results are shown in Table 4.

TABLE 4

| | Beam output (A) | Film thickness of dark blue titanium oxide layer (μm) | Evaluation | Good or not |
|---|---|---|---|---|
| Comparative Example 9 | 335 | 0.50 | The color tone is brownish; and the wear scar is brown. | Poor |
| Example 10 | 330 | 0.55 | The color tone is dark blue; and the wear scar is dark blue. | Good |

As noted from the results of Table 4, in Comparative Example 9 in which the film thickness of the dark blue titanium oxide layer is 0.50 μm, the color tone was not dark blue but brownish. For this reason, the wear scar became brown, and the brown wear scar was noticeable on the bluish green ground, so that the designability was inferior.

On the other hand, Example 10 in which the film thickness of the dark blue titanium oxide layer is 0.55 μm assumed a dark blue color tone. For this reason, the wear scar became dark blue, and the dark blue wear scar was hardly noticeable on the bluish green ground, so that the designability was not significantly worsened.

A test was performed for the purpose of examining a relation between the color tone and the film thickness of the colored titanium oxide layer serving as an outermost layer. The results are shown in Table 5.

TABLE 5

| Film thickness (μm) | Color tone |
|---|---|
| 0.04 | Bright yellow |
| 0.05 | Bluish purple |
| 0.06 | Blue |
| 0.08 | Light blue |
| 0.09 | Transparent |
| 0.10 | Yellow |
| 0.11 | Yellow |
| 0.12 | Bright yellow |
| 0.14 | Reddish purple |
| 0.15 | Bluish purple + bluish green |
| 0.16 | Bluish green |
| 0.17 | Bluish green |
| 0.18 | Bluish green |
| 0.19 | Bluish green + green |
| 0.20 | Green + bluish green |
| 0.21 | Green |
| 0.23 | Yellowish green + yellow |
| 0.25 | Reddish purple |
| 0.27 | Bluish green |
| 0.28 | Bluish green |
| 0.29 | Green |
| 0.30 | Green |
| 0.31 | Green |

In the foregoing, while the outline has been described in such a manner that the color tone successively changes to yellow, red, and blue, and again changes to yellow, red, and blue, in more detail, as noted from the results of Table 5, the color tone changes at a dizzying pace according to the change in the film thickness. In the course where the color tone changes at a dizzying pace in this way, by stopping the treatment at the stage of reaching the desired color tone, a product having a desired color tone is obtained. Among those, it may be said that as the bluish green color, the film thickness is preferably in a range of from 0.15 to 0.19 μm, and preferably from 0.16 to 0.18 μm. This range is the stage on the way of changing from the blue color of the second lap to the yellow color of the third lap.

It is to be noted that in the above-described treatment process, it is desired to regulate the film thickness of the oxide film to be deposited on the work such that it is uniform in all of the proportions by rotating the work or moving it right and left. In addition, a color tone with reproducibility is hardly obtained unless the amount of Ti flied from the evaporation source is uniform, and therefore, it is desired to regulate the amount of Ti within the hearth every time such that the flying amount of Ti is constant in every batch.

INDUSTRIAL APPLICABILITY

In accordance with the present invention, a sliding member for vehicular suspension including a wear resistant layer having appropriate mechanical strength and high designability on its outer peripheral sliding face and a method for producing the same are provided.

REFERENCE SIGNS LIST

1 Sliding member for vehicular suspension
2 Base material
3 Steel material (structural alloy steel)
4 Hard chromium plating
5 Wear resistant layer
6 Undercoat layer
7 Dark blue titanium oxide layer
8 Titanium intermediate layer
9 Colored titanium oxide layer
10 HCD type ion plating apparatus
11 Vacuum tank
12 Work
13 Ti raw material
14 Hearth
15 Hollow cathode-type electron gun (hollow cathode)
16 Ar gas introduction pipe
17 Focusing coil
18 Reactive gas introduction pipe
19 Direct current bias power source
20 Direct current power source
21 Vent
22 Heater
23 Shutter
25 Micro hardness tester
26 Berkovich indenter
27 Sample

The invention claimed is:

1. A sliding member for vehicular suspension comprising;
a colored wear resistant layer formed by an ion plating method and having a film thickness of 0.75 μm or more and 10 μm or less, said wear resistant layer being provided on an outer peripheral sliding face of the sliding member, wherein
the wear resistant layer includes a dark blue titanium oxide layer, a titanium intermediate layer, and a colored titanium oxide layer, which are laminated in this order from an inner peripheral side toward an outer peripheral side of the sliding member, and
the colored titanium oxide layer has a color tone that is different from dark blue.

2. The sliding member for vehicular suspension according to claim 1, wherein the colored titanium oxide layer is a bluish green titanium oxide layer having a film thickness of 0.15 μm or more and 0.19 μm or less.

3. A method for producing the sliding member for vehicular suspension according to claim 1, wherein
the ion plating method comprises using a hollow cathode discharge (HCD) ion plating apparatus, setting a beam output of the apparatus on forming the colored titanium oxide layer to 180 to 280 A, and controlling an oxygen partial pressure within a vacuum tank of the apparatus to a range of $8.1 \times 10^{-2}$ Pa or more and $1.2 \times 10^{-1}$ Pa or less.

4. The method for producing the sliding member for vehicular suspension according to claim 3, wherein the colored titanium oxide layer is a bluish green titanium oxide layer having a film thickness of 0.15 μm or more and 0.19 μm or less.

5. The sliding member for vehicular suspension according to claim 1, wherein the colored titanium oxide layer has a film thickness between 0.05 μm and 0.3 μm.

6. The sliding member for vehicular suspension according to claim 1, wherein the colored titanium oxide layer has the color tone selected from the group consisting of: bright yellow, bluish purple, yellow, reddish purple, bluish green, green, and yellowish green.

7. The sliding member for vehicular suspension according to claim 1, wherein the colored titanium oxide layer is formed by the ion plating method where a beam output is in a range of 180 A and 280 A.

* * * * *